United States Patent
Jeong

(10) Patent No.: US 9,842,974 B2
(45) Date of Patent: Dec. 12, 2017

(54) LIGHT EMITTING DEVICE INCLUDING A CONNECTION WIRING

(71) Applicant: LG INNOTEK CO., LTD., Seoul (KR)

(72) Inventor: Hwan Hee Jeong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 11 days.

(21) Appl. No.: 14/910,223

(22) PCT Filed: Aug. 1, 2014

(86) PCT No.: PCT/KR2014/007086
§ 371 (c)(1),
(2) Date: Feb. 4, 2016

(87) PCT Pub. No.: WO2015/020358
PCT Pub. Date: Feb. 12, 2015

(65) Prior Publication Data
US 2016/0211427 A1    Jul. 21, 2016

(30) Foreign Application Priority Data

Aug. 5, 2013 (KR) .................. 10-2013-0092447

(51) Int. Cl.
*H01L 33/38* (2010.01)
*H01L 33/62* (2010.01)
(Continued)

(52) U.S. Cl.
CPC ............ *H01L 33/62* (2013.01); *H01L 33/385* (2013.01); *H01L 33/405* (2013.01);
(Continued)

(58) Field of Classification Search
CPC ...... H01L 33/22; H01L 33/385; H01L 33/387
See application file for complete search history.

(56) References Cited

U.S. PATENT DOCUMENTS

2010/0207159 A1    8/2010  Jeong
2011/0193113 A1    8/2011  Jeong et al.
(Continued)

FOREIGN PATENT DOCUMENTS

CN    103165802 A    6/2013
JP    2010-087038 A    4/2010
(Continued)

OTHER PUBLICATIONS

Translation of the Written Opinion of the ISA, downloaded Jan. 20, 2017.*

*Primary Examiner* — Thomas L Dickey
(74) *Attorney, Agent, or Firm* — Birch, Stewart, Kolasch & Birch, LLP

(57) ABSTRACT

The present invention relates to a light emitting device. The light emitting device according to an embodiment of the present invention comprises: a light emitting structure comprising a first conductive semiconductor layer, an active layer under the first conductive semiconductor layer, and a second conductive semiconductor layer under the active layer; a channel layer arranged around the lower portion of the light emitting structure; a first electrode arranged on the channel layer; a second electrode arranged under the light emitting structure; and a connection wiring for electrically connecting the first electrode and the first conductive semiconductor layer.

20 Claims, 11 Drawing Sheets

(51) Int. Cl.
    *H01L 33/40*          (2010.01)
    *H01L 33/00*          (2010.01)
    *H01L 33/20*          (2010.01)
    *H01L 33/44*          (2010.01)

(52) U.S. Cl.
    CPC .......... *H01L 33/0079* (2013.01); *H01L 33/20* (2013.01); *H01L 33/44* (2013.01); *H01L 2224/48091* (2013.01); *H01L 2924/181* (2013.01); *H01L 2933/0016* (2013.01)

(56) References Cited

U.S. PATENT DOCUMENTS

2012/0080709 A1    4/2012    Haberern et al.
2013/0153950 A1*   6/2013    Mizutani ................ H01L 33/40
                                                                 257/99

FOREIGN PATENT DOCUMENTS

| JP | 2013-125929 A | 6/2013 |
|---|---|---|
| KR | 10-1039999 B1 | 6/2011 |
| KR | 10-2012-0019897 A | 3/2012 |
| KR | 10-2012-0087035 A | 8/2012 |

\* cited by examiner

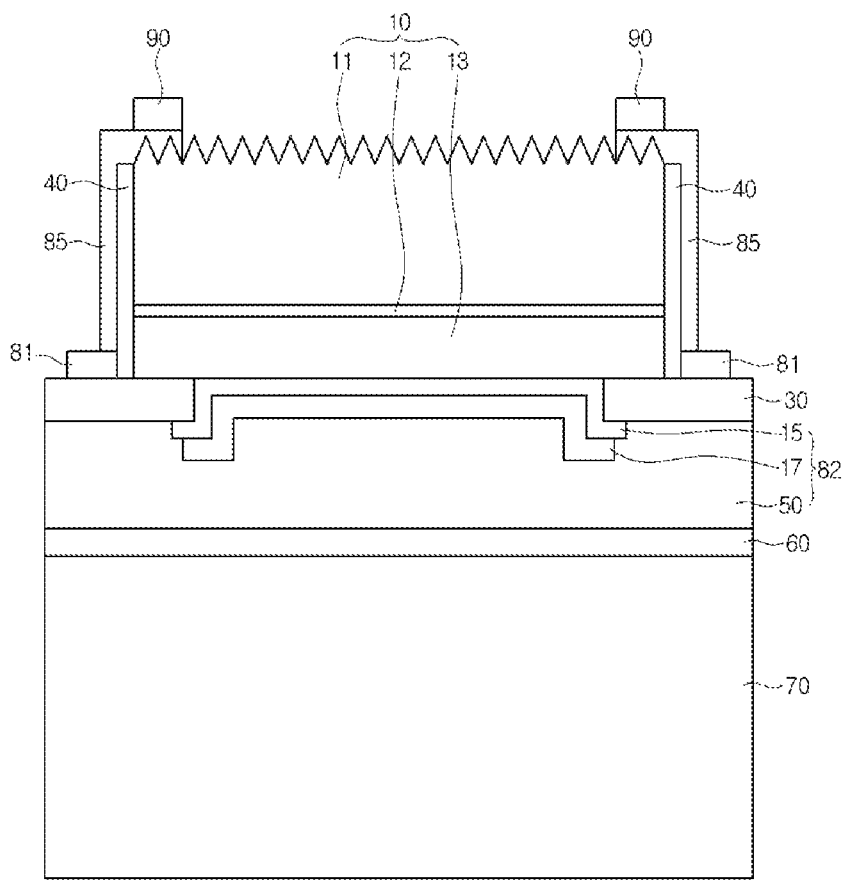
[FIG. 1]

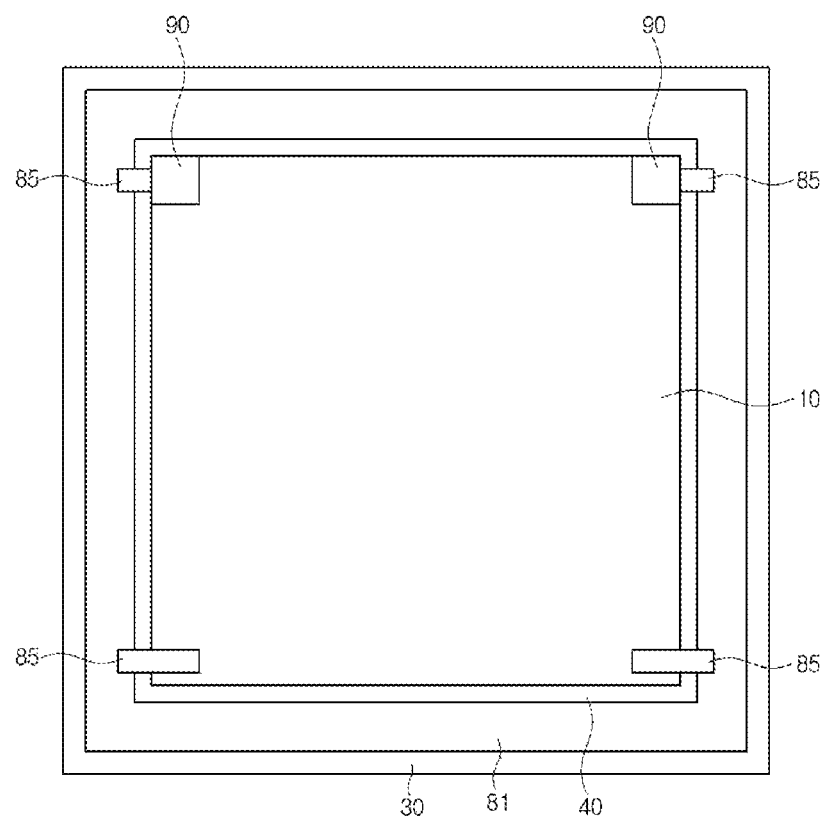
[FIG. 2]

【FIG. 3】
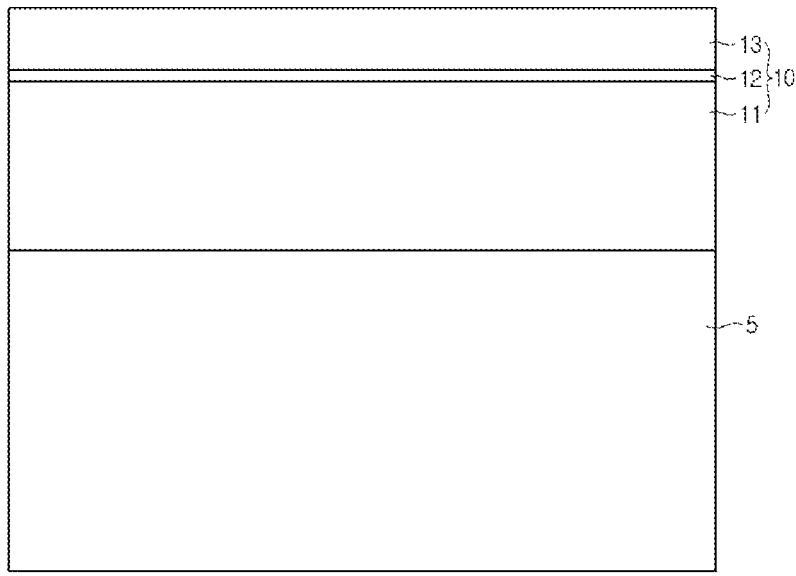
【FIG. 4】
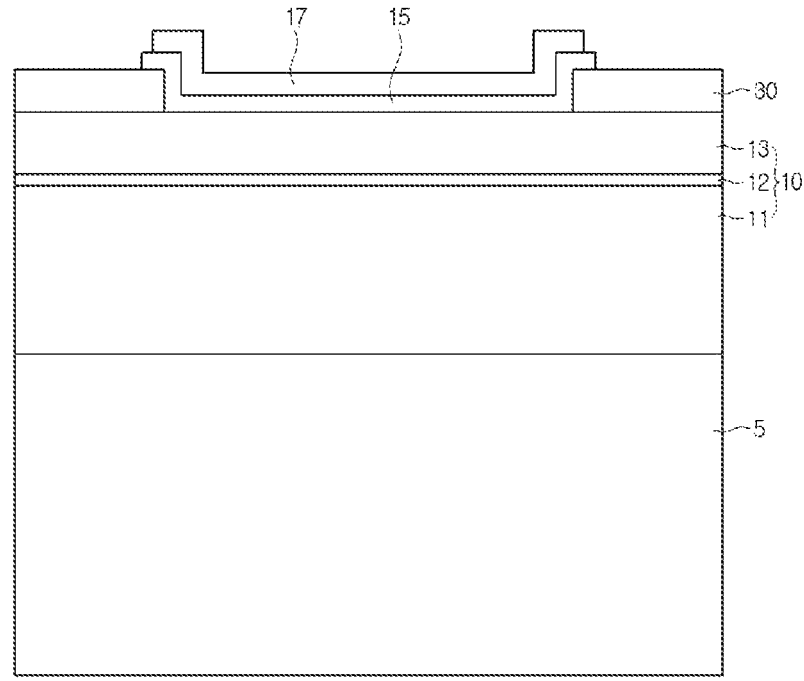

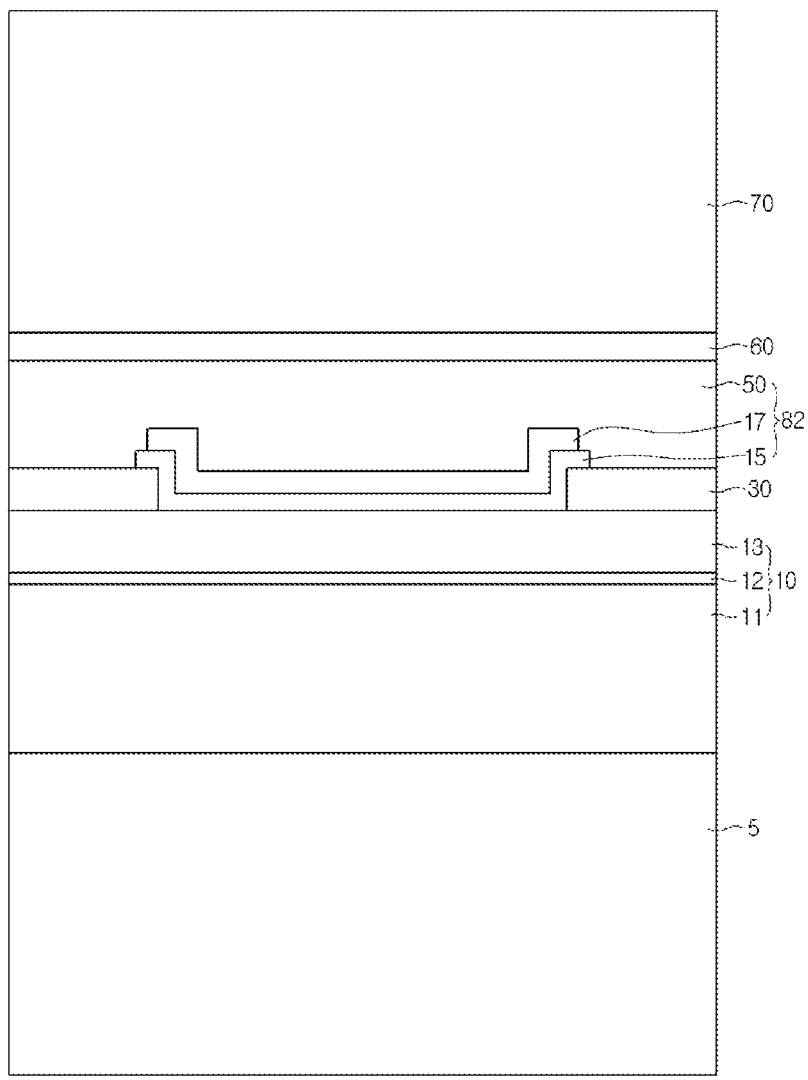
[FIG. 5]

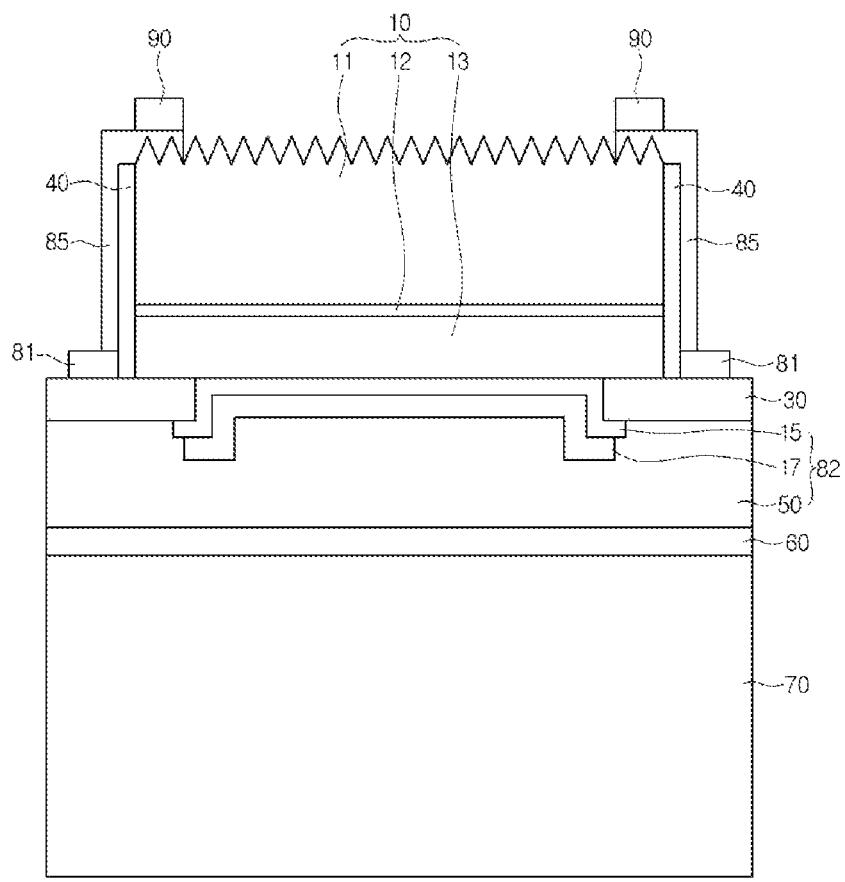
[FIG. 6]

[FIG. 7]
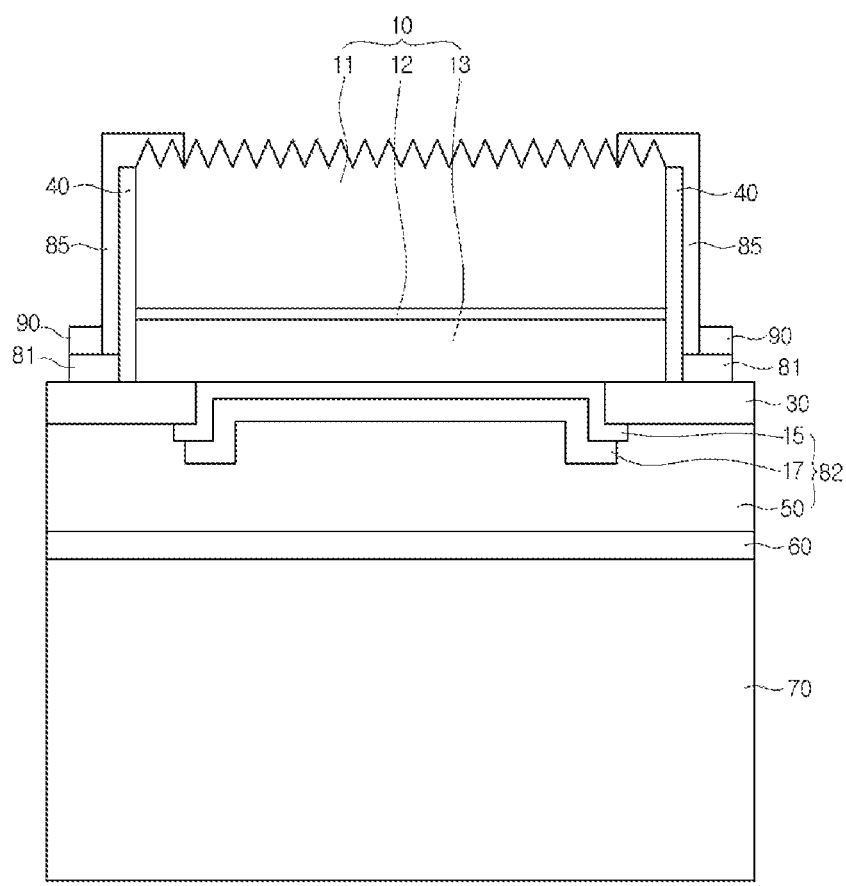

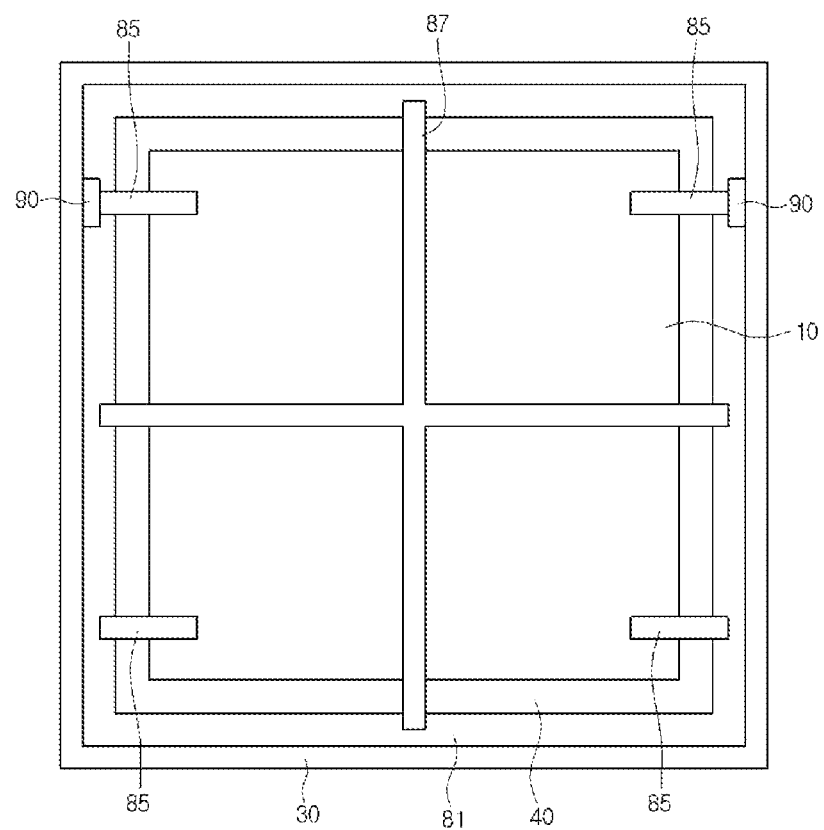
[FIG. 8]

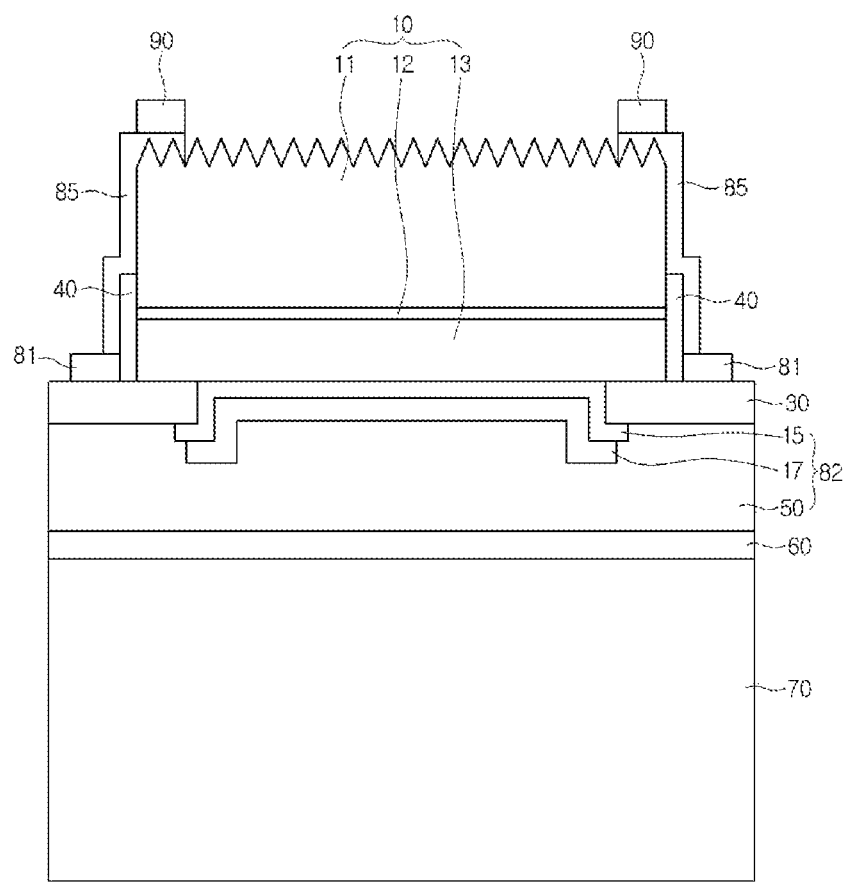

[FIG. 10]
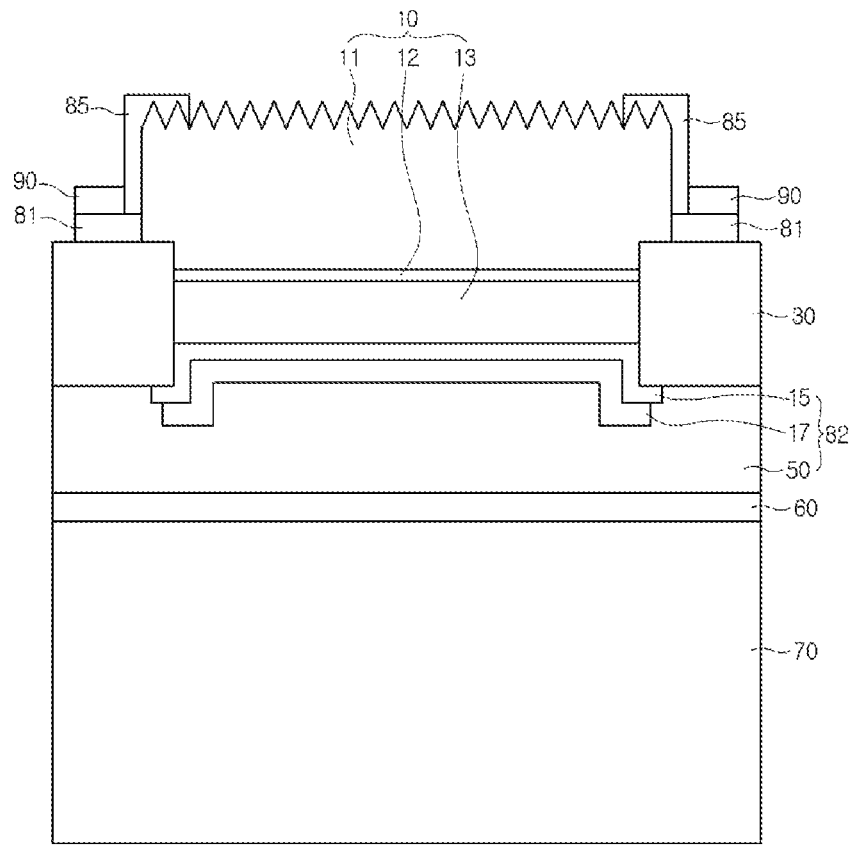
[FIG. 11]
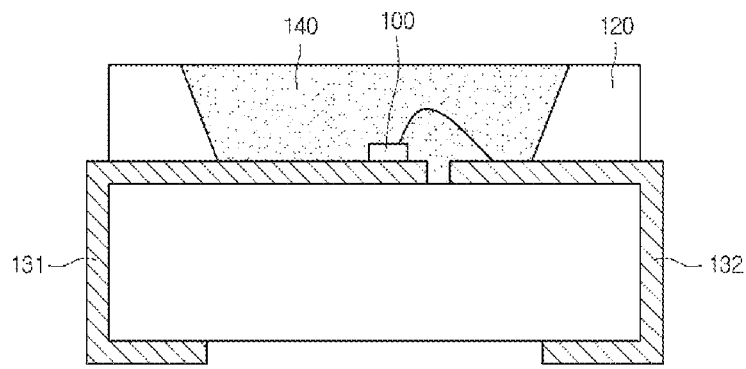

【FIG. 12】
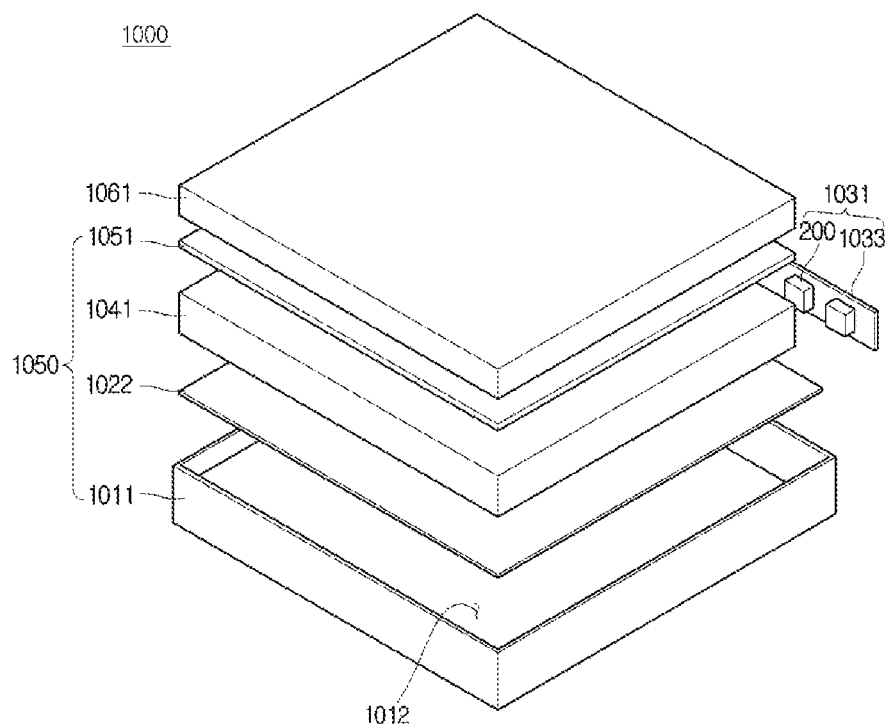
【FIG. 13】
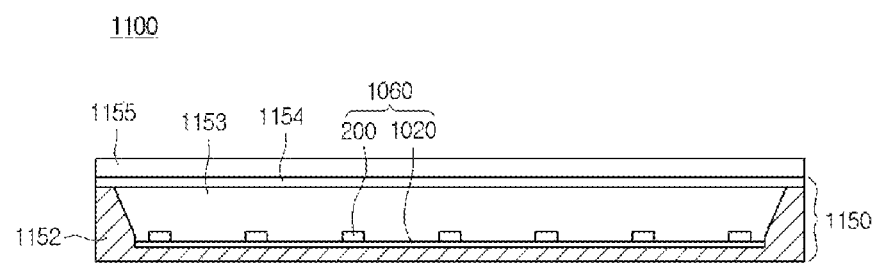

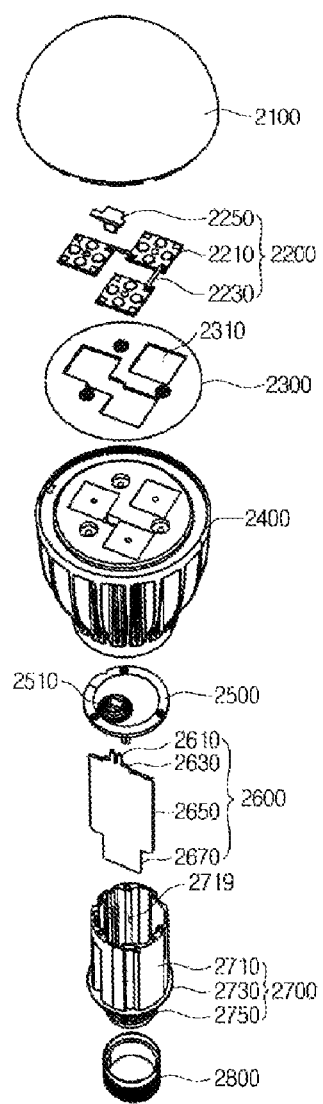
[FIG. 14]

LIGHT EMITTING DEVICE INCLUDING A CONNECTION WIRING

TECHNICAL FIELD

The embodiment relates to a light emitting device, a light emitting device package, and a light unit.

BACKGROUND ART

A light emitting diode (LED) has been extensively used as one of light emitting devices. The LED converts electrical signals into the form of light such as infra-red light, ultraviolet light, and visible light by using the characteristic of a compound semiconductor.

As the light efficiency of the light emitting device is increased, the LED has been used in various fields such as display apparatuses and lighting appliances.

DISCLOSURE

Technical Problem

The embodiment provides a light emitting device, a light emitting device package, and a light unit, capable of improving light efficiency by expanding a light emitting area.

Technical Solution

A light emitting device according to the embodiment includes: a light emitting structure including a first conductive semiconductor layer, an active under the first conductive semiconductor layer, and a second conductive semiconductor layer under the active layer; a channel layer around a lower portion of the light emitting structure; a first electrode on the channel layer; a second electrode under the light emitting structure; and a connection wiring for electrically connecting the first electrode and the first conductive semiconductor layer.

Advantageous Effects

The light emitting device, the light emitting device package, and the light unit according to the embodiment can improve the light efficiency by expanding the light emitting area.

DESCRIPTION OF DRAWINGS

FIG. 1 is a view showing a light emitting device according to the embodiment.

FIG. 2 is a plan view of a light emitting device shown in FIG. 1.

FIGS. 3 to 6 are views showing a method of fabricating a light emitting device according to the embodiment.

FIGS. 7 to 10 are views showing other examples of a light emitting device according to the embodiment.

FIG. 11 is a view showing a light emitting device package according to the embodiment.

FIG. 12 is a view showing a display device according to the embodiment.

FIG. 13 is a view showing another example of the display device according to the embodiment.

FIG. 14 is a view showing a lighting apparatus according to the embodiment.

BEST MODE

[Mode for Invention]

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

Hereinafter, a light emitting device, a light emitting device package, a light unit, and a method for fabricating the light emitting device according to the embodiments will be described in detail with reference to accompanying drawings.

FIG. 1 is a view showing a light emitting device according to the embodiment and FIG. 2 is a plan view of the light emitting device shown in FIG. 1.

As shown in FIGS. 1 and 2, the light emitting device according to the embodiment may include a light emitting structure 10, a channel layer 30, a first electrode 81, a second electrode 82 and a connection wiring 85.

The light emitting structure 10 may include a first conductive semiconductor layer 11, an active layer 12, and a second conductive semiconductor layer 13. The active layer 12 may be disposed between the first conductive semiconductor layer 11 and the second conductive semiconductor layer 13. The active layer 12 may be disposed under the first conductive semiconductor layer 11 and the second conductive semiconductor layer 13 may be disposed under the active layer 12.

For example, the first conductive semiconductor layer 11 may be prepared as an n type semiconductor layer doped with n type dopant serving as first conductive dopant, and the second conductive semiconductor layer 13 may be prepared as a p type semiconductor layer doped with p type dopant serving as second conductive dopant. In addition, the first conductive semiconductor layer 11 may be prepared as a p type semiconductor layer and the second conductive semiconductor layer 13 may be prepared as an n type semiconductor layer.

For example, the first conductive semiconductor layer 11 may include an n-type semiconductor layer. The first conductive semiconductor layer 11 may be prepared by using a compound semiconductor. For instance, the first conductive semiconductor layer 11 may be prepared by using a group II-VI compound semiconductor or a group III-V compound semiconductor.

For example, the first conductive semiconductor layer 11 may be realized by using a semiconductor material having a compositional formula of $In_xAl_yGa_{1-x-y}N$ ($0 \le x \le 1$, $0 \le y \le 1$, $0 \le x+y \le 1$). For example, the first conductive semiconductor layer 11 may include one selected from the group consisting of GaN, AlN, AlGaN, InGaN, InN, InAlGaN, AlInN, AlGaAs, GaP, GaAs, GaAsP, and AlGaInP doped with n-type dopants such as Si, Ge, Sn, Se or Te.

Electrons (or holes) injected through the first conductive semiconductor layer 11 and holes (or electrons) injected through the second conductive semiconductor layer 13 are combined in the active layer 12 so that the active layer 12 emits light corresponding to the energy band gap difference according to materials constituting the active layer 12. The active layer 12 may have one of a single quantum well (SQW) structure, a multi-quantum well (MQW) structure, a quantum dot structure, and a quantum wire structure, but the embodiment is not limited thereto.

The active layer 12 may be realized by using a compound semiconductor. The active layer 12 may be realized by using a semiconductor material having a compositional formula of InxAlyGa1-x-yN ($0 \leq x \leq 1$, $0 \leq y \leq 1$, $0 \leq x+y \leq 1$). When the active layer 12 has an MQW structure, the active layer 12 may be formed by stacking a plurality of well layers and a plurality of barrier layers. For example, the active layer 12 may have a cycle of InGaN well layer/GaN barrier layer.

The second conductive semiconductor layer 13 may include a p-type semiconductor layer. For example, the second conductive semiconductor layer 13 may be realized by using a compound semiconductor. For example, the second conductive semiconductor layer 13 may be realized by using a group II-VI compound semiconductor or a group III-V compound semiconductor.

For example, the second conductive semiconductor layer 13 may be realized by using a semiconductor material having a compositional formula of InxAlyGa1-x-yN ($0 \leq x \leq 1$, $0 \leq y \leq 1$, $0 \leq x+y \leq 1$). For example, the second conductive semiconductor layer 13 may include one selected from the group consisting of GaN, AlN, AlGaN, InGaN, InN, InAlGaN, AlInN, AlGaAs, GaP, GaAs, GaAsP, and AlGaInP doped with p-type dopants such as Mg, Zn, Ca, Sr or Ba.

Meanwhile, the first conductive semiconductor layer 11 may include a p type semiconductor layer and the second conductive semiconductor layer 13 may include an n type semiconductor layer. In addition, a semiconductor layer including an n type or a p type semiconductor layer may be further provided under the second conductive semiconductor layer 13. Thus, the light emitting structure 10 may have at least one of np, pn, npn, and pnp junction structures. In addition, impurities may be doped into the first conductive semiconductor layer 11 and the second conductive semiconductor layer 13 with uniform or non-uniform doping concentration. In other words, the light emitting structure 10 according to the embodiment may be variously configured, and the embodiment is not limited thereto.

In addition, a first conductive InGaN/GaN superlattice structure or InGaN/InGaN superlattice structure may be formed between the first conductive semiconductor layer 11 and the active layer 12. In addition, a second conductive AlGaN layer may be formed between the second conductive semiconductor layer 13 and the active layer 12.

The light emitting device according to the embodiment may include the channel layer 30 arranged around a lower portion of the light emitting structure 10. For example, a top surface of the channel layer 30 may be aligned on the same plane with a bottom surface of the light emitting structure 10. One end of the channel layer 30 may be disposed under the second conductive semiconductor layer 13. One end of the channel layer 30 may come into contact with the bottom surface of the second conductive semiconductor layer 13. One end of the channel layer 30 may be disposed between the second conductive semiconductor layer 13 and the second electrode 82. One end of the channel layer 30 may be disposed between the second conductive semiconductor layer 13 and an ohmic contact layer 15.

For example, the channel layer 30 may be formed of oxide or nitride. For instance, the channel layer 30 may include at least one selected from the group consisting of $SiO_2$, $Si_xO_y$, $Si_3N_4$, $Si_xN_y$, $SiO_xN_y$, $Al_2O_3$, $TiO_2$, or AlN. The channel layer 30 may be called an isolation layer. The channel layer 30 may serve as an etching stopper when an isolation process is performed later with respect to the light emitting structure 10 and may prevent the electric characteristics of the light emitting device from being degraded caused by the isolation process.

The first electrode 81 may be disposed on the channel layer 30. The first electrode 81 may directly make contact with the top surface of the channel layer 30. The first electrode 81 may be arranged around a lower portion of the light emitting structure 10. The first electrode 81 may surround the light emitting structure 10. The first electrode 81 may have a width smaller than a width of the channel layer 30. For example, the channel layer 30 may have a width in the range of 5 micrometers to 70 micrometers and the first electrode 81 may have a width in the range of 5 micrometers to 30 micrometers.

The first electrode 81 may be electrically connected to the first conductive semiconductor layer 11. The first electrode 81 may be electrically connected to the first conductive semiconductor layer 11 through the connection wiring 85. The connection wiring 85 may electrically connect the first electrode 81 with the first conductive semiconductor layer 11.

The connection wiring 85 may be disposed on the first conductive semiconductor layer 11. The connection wiring 85 may be disposed on the first electrode 81. The connection wiring 85 may be disposed at a lateral side of the light emitting structure 10. A plurality of connection wirings 85 may be provided. At least two connection wirings 85 may be provided. The number of connection wiring 85 may be properly selected such that power applied from the first electrode 81 can be distributed onto the first conductive semiconductor layer 11. For example, 1 to 64 connection wirings 85 may be selectively provided by taking the operating voltage into consideration. For example, the first electrode 81 and the connection wiring 85 may include at least one of Cr, V, W, Ti, Zn, Ni, Pt, Cu, Al, Au, and Mo.

According to the light emitting device of the embodiment, the first electrode 81 may not be disposed on the light emitting structure 10. A part of the connection wiring 85 electrically connected to the first electrode 81 may be disposed on the light emitting structure 10. According to the embodiment, an area of a metal layer disposed on the first conductive semiconductor layer 11 is minimized so that the light emitting area can be expanded in the upward direction of the light emitting structure 10. Thus, the light emitting device according to the embodiment can improve the light efficiency.

The light emitting device according to the embodiment may include a bonding pad 90 electrically connected to the first electrode 81. The bonding pad 90 may be disposed on the light emitting structure 10. The bonding pad 90 may be disposed on the connection wiring 85. The bonding pad 90 may be disposed on the first conductive semiconductor layer 11. The bonding pad 90 may be disposed at one lateral side of the first conductive semiconductor layer 11. The bonding pad 90 may be disposed at an edge area of one lateral side of the first conductive semiconductor layer 11. The bonding pad 90 may be disposed in the diagonal direction of the first conductive semiconductor layer 11. For example, the bonding pad 90 may include at least one of Cr, V, W, Ti, Zn, Ni, Pt, Cu, Al, Au, or Mo.

The light emitting device according to the embodiment may include the insulating layer 40 disposed between the connection wiring 85 and the light emitting structure 10. The insulating layer 40 may be disposed between the connection wiring 85 and the active layer 12. The insulating layer 40 may be disposed between the connection wiring 85 and the second conductive semiconductor layer 13.

For example, the insulating layer 40 may be formed of oxide or nitride. For instance, the insulating layer 40 may include at least one selected from the group consisting of $SiO_2$, $Si_xO_y$, $Si_3N_4$, $Si_xN_y$, $SiO_xN_y$, $Al_2O_3$, $TiO_2$, or AlN.

The light emitting device according to the embodiment may include a reflective layer 17 disposed under the light emitting structure 10. The reflective layer 17 may be electrically connected to the second conductive semiconductor layer 13. The reflective layer 17 may be disposed under the second conductive semiconductor layer 13.

The light emitting device according to the embodiment may include the ohmic contact layer 15 disposed between the reflective layer 17 and the second conductive semiconductor layer 13. The ohmic contact layer 15 may come into contact with the second conductive semiconductor layer 13.

The ohmic contact layer 15 may come into ohmic-contact with the light emitting structure 10. The ohmic contact layer 15 may include an area making ohmic-contact with the light emitting structure 10. The reflective layer 17 may be electrically connected to the second conductive semiconductor layer 13. The reflective layer 17 may have the function of increasing quantity of light extracted to the outside by reflecting light incident thereto from the light emitting structure 10.

For example, the ohmic contact layer 15 may include a transparent conductive oxide layer. For example, the ohmic contact layer 15 may include at least one selected from the group consisting of an ITO (Indium Tin Oxide), an IZO (Indium Zinc Oxide), an AZO (Aluminum Zinc Oxide), an AGZO (Aluminum Gallium Zinc Oxide), an IZTO (Indium Zinc Tin Oxide), an IAZO (Indium Aluminum Zinc Oxide), an IGZO (Indium Gallium Zinc Oxide), an IGTO (Indium Gallium Tin Oxide), an ATO (Antimony Tin Oxide), a GZO (Gallium Zinc Oxide), an IZON (IZO Nitride), ZnO, IrOx, RuOx, NiO, Pt, Ag or Ti.

The reflective layer 17 may include a material having high reflectance. For example, the reflective layer 17 may include a metal including at least one of Ag, Ni, Al, Rh, Pd, Ir, Ru, Mg, Zn, Pt, Cu, Au, or Hf, or an alloy thereof. In addition, the reflective layer 17 may be prepared as a multi-layer by using the metal or the alloy thereof and a transmissive conductive material such as an ITO (Indium-Tin-Oxide), an IZO (Indium-Zinc-Oxide), an IZTO (Indium-Zinc-Tin-Oxide), an IAZO (Indium-Aluminum-Zinc-Oxide), an IGZO (Indium-Gallium-Zinc-Oxide), an IGTO (Indium-Gallium-Tin-Oxide), an AZO (Aluminum-Zinc-Oxide), or an ATO (Antimony-Tin-Oxide). For example, according to the embodiment, the reflective layer 17 may include at least one of Ag, Al, an Ag—Pd—Cu alloy, or an Ag—Cu alloy.

For example, the reflective layer 17 may include an Ag layer and a Ni layer, which are alternately aligned, and may include a Ni/Ag/Ni layer, a Ti layer or a Pt layer. In addition, the ohmic contact layer 15 may be formed on the reflective layer 17 and at least a part of the ohmic contact layer 15 may come into ohmic-contact with the light emitting structure 10 through the reflective layer 17.

The light emitting device according to the embodiment may include a metal layer 50 disposed under the reflective layer 17. The metal layer 50 may include at least one of Au, Cu, Ni, Ti, Ti—W, Cr, W, Pt, V, Fe, or Mo.

According to the embodiment, the second electrode 82 may include at least one of the reflective layer 17, the ohmic contact layer 15 and the metal layer 50. For example, the second electrode 82 may include all of the reflective layer 17, the ohmic contact layer 15 and the metal layer 50 or may selectively include one or two layers.

The metal layer 50 may serve as a diffusion barrier layer. A bonding layer 60 and a conductive support member 70 may be disposed under the metal layer 50.

The metal layer 50 may prevent a material included in the bonding layer 60 from being diffused to the reflective layer 17 in the process of providing the bonding layer 60. The metal layer 50 may prevent a material, such as Sn, included in the bonding layer 60 from exerting an influence upon the reflective layer 17.

The bonding layer 60 may include barrier metal or bonding metal. For example, the bonding layer 60 may include at least one of Ti, Au, Sn, Ni, Cr, Ga, In, Bi, Cu, Ag, Nb, Pd and Ta. The conductive support member 70 may support the light emitting structure 10 according to the embodiment while performing a heat radiation function. The bonding layer 60 may be implemented as a seed layer.

The conductive support member 70 may include at least one of semiconductor substrates (e.g., Si, Ge, GaN, GaAs, ZnO, SiC, and SiGe substrates) implanted with Ti, Cr, Ni, Al, Pt, Au, W, Cu, Mo, Cu—W, or impurities.

According to the embodiment, power may be applied to the light emitting structure 10 through the second electrode 82 and the first electrode 81. According to the embodiment, the first electrode 81 may include an ohmic layer, an intermediate layer, and an upper layer. The ohmic layer may include a material selected from the group consisting of Cr, V, W, Ti, and Zn to realize ohmic contact. The intermediate layer may be realized by using a material selected from the group consisting of Ni, Cu, and Al. For example, the upper layer may include Au. The first electrode 81 may include at least one selected from the group consisting of Cr, V, W, Ti, Zn, Ni, Cu, Al, Au and Mo.

A roughness may be formed on a top surface of the first conductive semiconductor layer 11. Thus, quantity of light extracted in the upward direction may be increased at the area where the roughness is formed.

In addition, according to the embodiment, the first electrode 81 is not disposed at an upper portion of the light emitting structure 10, so the light emitting area can be expanded. That is, according to the embodiment, the light extracted through the top surface of the light emitting structure 10 may not be absorbed in the first electrode 81 so that the light efficiency can be improved.

Hereinafter, a method of fabricating the light emitting device according to the embodiment will be described with reference to FIGS. 3 to 6.

According to the method of fabricating the light emitting device of the embodiment, as shown in FIG. 3, the first conductive semiconductor layer 11, the active layer 12, and the second conductive semiconductor layer 13 may be formed on a substrate 5. The first conductive semiconductor layer 11, the active layer 12, and the second conductive semiconductor layer 13 may be defined as the light emitting structure 10.

For example, the substrate 5 may include at least one of a sapphire substrate ($Al_2O_3$), SiC, GaAs, GaN, ZnO, Si, GaP, InP, or Ge, but the embodiment is not limited thereto. A buffer layer may be interposed between the first conductive semiconductor layer 11 and the substrate 5.

For example, the first conductive semiconductor layer 11 may include an n type semiconductor layer doped with n type dopant serving as first conductive dopant and the second conductive semiconductor layer 13 may include a p type semiconductor layer doped with p type dopant serving as second conductive dopant. In addition, the first conductive semiconductor layer 11 may include the p type semiconductor layer and the second conductive semiconductor layer 13 may include the n type semiconductor layer.

For example, the first conductive semiconductor layer 11 may include the n type semiconductor layer. The first conductive semiconductor layer 11 may be formed of a semiconductor material having a compositional formula of $In_xAl_yGa_{1-x-y}N$ ($0\leq x\leq 1$, $0\leq y\leq 1$, $0\leq x+y\leq 1$). For example, the first conductive semiconductor layer 11 may include one selected from the group consisting of InAlGaN, GaN, AlGaN, AlInN, InGaN, AlN and InN doped with n-type dopants such as Si, Ge, Sn, Se and Te.

Electrons (or holes) injected through the first conductive semiconductor layer 11 and holes (or electrons) injected through the second conductive semiconductor layer 13 are combined in the active layer 12 so that the active layer 12 emits light corresponding to the energy band gap difference according to materials constituting the active layer 12. The active layer 12 may have one of a single quantum well (SQW) structure, a multi-quantum well (MQW) structure, a quantum dot structure, and a quantum wire structure, but the embodiment is not limited thereto.

The active layer 12 may be realized by using a compound semiconductor. The active layer 12 may be realized by using a semiconductor material having a compositional formula of InxAlyGa1-x-yN ($0\leq x\leq 1$, $0\leq y\leq 1$, $0\leq x+y\leq 1$). When the active layer 12 has an MQW structure, the active layer 12 may be formed by stacking a plurality of well layers and a plurality of barrier layers. For example, the active layer 12 may have a cycle of InGaN well layer/GaN barrier layer.

For example, the second conductive semiconductor layer 13 may include the p-type semiconductor layer. For example, the second conductive semiconductor layer 13 may be realized by using a semiconductor material having a compositional formula of InxAlyGa1-x-yN ($0\leq x\leq 1$, $0\leq y\leq 1$, $0\leq x+y\leq 1$). For example, the second conductive semiconductor layer 13 may include one selected from the group consisting of InAlGaN, GaN, AlGaN, AlInN, InGaN, AlN and InN doped with p-type dopants such as Mg, Zn, Ca, Sr and Ba.

Meanwhile, the first conductive semiconductor layer 11 may include the p type semiconductor layer and the second conductive semiconductor layer 13 may include the n type semiconductor layer. In addition, a semiconductor layer including an n type or a p type semiconductor layer may be further provided on the second conductive semiconductor layer 13. Thus, the light emitting structure 10 may have at least one of np, pn, npn, and pnp junction structures. In addition, impurities may be doped into the first conductive semiconductor layer 11 and the second conductive semiconductor layer 13 with uniform or non-uniform doping concentration. In other words, the light emitting structure 10 according to the embodiment may be variously configured, and the embodiment is not limited thereto.

In addition, a first conductive InGaN/GaN superlattice structure or InGaN/InGaN superlattice structure may be formed between the first conductive semiconductor layer 11 and the active layer 12. In addition, a second conductive AlGaN layer may be formed between the second conductive semiconductor layer 13 and the active layer 12.

Next, as shown in FIG. 4, the channel layer 30 may be formed on the light emitting structure 10. The channel layer 30 may be formed of insulating material. The channel layer 30 may be formed of oxide or nitride. For instance, the channel layer 30 may include at least one selected from the group consisting of $SiO_2$, $Si_xO_y$, $Si_3N_4$, $Si_xN_y$, $SiO_xN_y$, $Al_2O_3$, $TiO_2$, and AlN.

Then, as shown in FIG. 4, the ohmic contact layer 15 and the reflective layer 17 may be formed on the light emitting structure 10.

The ohmic contact layer 15 may be disposed between the reflective layer 17 and the second conductive semiconductor layer 13. The ohmic contact layer 15 may come into contact with the second conductive semiconductor layer 13.

The ohmic contact layer 15 may come into ohmic-contact with the light emitting structure 10. The reflective layer 17 may be electrically connected to the second conductive semiconductor layer 13. The ohmic contact layer 15 may include an area making ohmic-contact with the light emitting structure 10.

For example, the ohmic contact layer 15 may include a transparent conductive oxide layer. For example, the ohmic contact layer 15 may include at least one selected from the group consisting of an ITO (Indium Tin Oxide), an IZO (Indium Zinc Oxide), an AZO (Aluminum Zinc Oxide), an AGZO (Aluminum Gallium Zinc Oxide), an IZTO (Indium Zinc Tin Oxide), an IAZO (Indium Aluminum Zinc Oxide), an IGZO (Indium Gallium Zinc Oxide), an IGTO (Indium Gallium Tin Oxide), an ATO (Antimony Tin Oxide), a GZO (Gallium Zinc Oxide), an IZON (IZO Nitride), ZnO, IrOx, RuOx, NiO, Pt, Ag and Ti.

The reflective layer 17 may include a material having high reflectance.

For example, the reflective layer 17 may include a metal including at least one of Ag, Ni, Al, Rh, Pd, Ir, Ru, Mg, Zn, Pt, Cu, Au, and Hf, or an alloy thereof. In addition, the reflective layer 17 may be prepared as a multi-layer by using the metal or the alloy thereof and a transmissive conductive material such as an ITO (Indium-Tin-Oxide), an IZO (Indium-Zinc-Oxide), an IZTO (Indium-Zinc-Tin-Oxide), an IAZO (Indium-Aluminum-Zinc-Oxide), an IGZO (Indium-Gallium-Zinc-Oxide), an IGTO (Indium-Gallium-Tin-Oxide), an AZO (Aluminum-Zinc-Oxide), or an ATO (Antimony-Tin-Oxide). For example, according to the embodiment, the reflective layer 17 may include at least one of Ag, Al, an Ag—Pd—Cu alloy, and an Ag—Cu alloy.

For example, the reflective layer 17 may include an Ag layer and a Ni layer, which are alternately aligned, and may include a Ni/Ag/Ni layer, a Ti layer or a Pt layer. In addition, the ohmic contact layer 15 may be formed on the reflective layer 17 and at least a part of the ohmic contact layer 15 may come into ohmic-contact with the light emitting structure 10 through the reflective layer 17.

Then, as shown in FIG. 5, the metal layer 50, the bonding layer 60 and the conductive support member 70 may be provided on the reflective layer 17.

The metal layer 50 may include at least one of Au, Cu, Ni, Ti, Ti—W, Cr, W, Pt, V, Fe, and Mo. According to the embodiment, the second electrode 82 may include at least one of the reflective layer 17, the ohmic contact layer 15 and the metal layer 50. For example, the second electrode 82 may include all of the reflective layer 17, the ohmic contact layer 15 and the metal layer 50 or may selectively include one or two layers.

The metal layer 50 may serve as a diffusion barrier layer. The bonding layer 60 and the conductive support member 70 may be disposed on the metal layer 50.

The metal layer 50 may prevent a material included in the bonding layer 60 from being diffused to the reflective layer 17 in the process of providing the bonding layer 60. The metal layer 50 may prevent a material, such as Sn, included in the bonding layer 60 from exerting an influence upon the reflective layer 17.

The bonding layer 60 may include barrier metal or bonding metal. For example, the bonding layer 60 may include at least one of Ti, Au, Sn, Ni, Cr, Ga, In, Bi, Cu, Ag, Nb, Pd and Ta. The conductive support member 70 may support the light emitting structure 10 according to the embodiment while performing a heat radiation function. The bonding layer 60 may be implemented as a seed layer.

The conductive support member 70 may include at least one of semiconductor substrates (e.g., Si, Ge, GaN, GaAs, ZnO, SiC, and SiGe substrates) implanted with Ti, Cr, Ni, Al, Pt, Au, W, Cu, Mo, Cu—W or impurities.

Next, the substrate 5 is removed from the first conductive semiconductor layer 11. According to one example, the substrate 5 may be removed through a laser lift off (LLO) process. The LLO process is a process to delaminate the substrate 5 from the first conductive semiconductor layer 11 by irradiating a laser to the bottom surface of the substrate 5.

Then, as shown in FIG. 6, the lateral side of the light emitting structure 10 is etched through an isolation etching process to expose a portion of the channel layer 30. The isolation etching process may be performed through a dry etching process such as an inductively coupled plasma (ICP) process, but the embodiment is not limited thereto.

A roughness may be formed on a top surface of the light emitting structure 10. A light extraction pattern may be formed on the top surface of the light emitting structure 10. A concavo-convex pattern may be formed on the top surface of the light emitting structure 10. For example, the light extraction pattern may be formed on the light emitting structure 10 through a PEC (photo electro chemical) etching process. Thus, according to the embodiment, the light extraction efficiency to the outside can be improved.

Then, as shown in FIG. 6, the insulating layer 40, the first electrode 81, the connection wiring 85 and the bonding pad 90 may be formed.

The insulating layer 40 may be formed around the light emitting structure 10. The insulating layer 40 may be formed of oxide or nitride. For instance, the insulating layer 40 may include at least one selected from the group consisting of $SiO_2$, $Si_xO_y$, $Si_3N_4$, $Si_xN_y$, $SiO_xN_y$, $Al_2O_3$, $TiO_2$, and AlN.

The first electrode 81 may be disposed on the channel layer 30. The first electrode 81 may be disposed at a lateral side of the insulating layer 40. The first electrode 81 may be electrically connected to the first conductive semiconductor layer 11 through the connection wiring 85. Then, the bonding pad 90 may be electrically connected to the connection wiring 85.

The first electrode 85 may be formed on the channel layer 30. The first electrode 85 may directly make contact with the top surface of the channel layer 30. The first electrode 81 may be arranged around a lower portion of the light emitting structure 10. The first electrode 81 may surround the light emitting structure 10. The first electrode 81 may have a width smaller than a width of the channel layer 30. For example, the channel layer 30 may have a width in the range of 5 micrometers to 70 micrometers and the first electrode 81 may have a width in the range of 5 micrometers to 30 micrometers.

The first electrode 81 may be electrically connected to the first conductive semiconductor layer 11. The first electrode 81 may be electrically connected to the first conductive semiconductor layer 11 through the connection wiring 85. The connection wiring 85 may electrically connect the first electrode 81 with the first conductive semiconductor layer 11.

The connection wiring 85 may be disposed on the first conductive semiconductor layer 11. The connection wiring 85 may be disposed on the first electrode 81. The connection wiring 85 may be disposed at a lateral side of the light emitting structure 10. A plurality of connection wirings 85 may be provided. At least two connection wirings 85 may be provided. The number of connection wiring 85 may be properly selected such that power applied from the first electrode 81 can be distributed onto the first conductive semiconductor layer 11. For example, 1 to 64 connection wirings 85 may be selectively provided. For example, the first electrode 81 and the connection wiring 85 may include at least one of Cr, V, W, Ti, Zn, Ni, Pt, Cu, Al, Au, and Mo.

According to the light emitting device of the embodiment, the first electrode 81 may not be disposed on the light emitting structure 10. A part of the connection wiring 85 electrically connected to the first electrode 81 may be disposed on the light emitting structure 10. According to the embodiment, an area of a metal layer disposed on the first conductive semiconductor layer 11 is minimized so that the light emitting area can be expanded in the upward direction of the light emitting structure 10. Thus, the light emitting device according to the embodiment can improve the light efficiency.

The light emitting device according to the embodiment may include a bonding pad 90 electrically connected to the first electrode 81. The bonding pad 90 may be disposed on the light emitting structure 10. The bonding pad 90 may be disposed on the first conductive semiconductor layer 11. The bonding pad 90 may be disposed at one lateral side of the first conductive semiconductor layer 11. The bonding pad 90 may be disposed at an edge area of one lateral side of the first conductive semiconductor layer 11. The bonding pad 90 may be disposed in the diagonal direction of the first conductive semiconductor layer 11. For example, the bonding pad 90 may include at least one of Cr, V, W, Ti, Zn, Ni, Pt, Cu, Al, Au, and Mo.

According to the embodiment, the second electrode 82 may include at least one of the reflective layer 17, the ohmic contact layer 15 and the metal layer 50. For example, the second electrode 82 may include all of the reflective layer 17, the ohmic contact layer 15 and the metal layer 50 or may selectively include one or two layers.

According to the embodiment, power may be applied to the light emitting structure 10 through the second electrode 82 and the first electrode 81. According to the embodiment, the first electrode 81 may include an ohmic layer, an intermediate layer, and an upper layer. The ohmic layer may include a material selected from the group consisting of Cr, V, W, Ti, and Zn to realize ohmic contact. The intermediate layer may be realized by using a material selected from the group consisting of Ni, Cu, and Al. For example, the upper layer may include Au. The first electrode 81 may include at least one selected from the group consisting of Cr, V, W, Ti, Zn, Ni, Cu, Al, Au and Mo.

In addition, according to the embodiment, the first electrode 81 is not disposed at an upper portion of the light emitting structure 10, so the light emitting area can be expanded. That is, according to the embodiment, the light extracted through the top surface of the light emitting structure 10 may not be absorbed in the first electrode 81 so that the light efficiency can be improved.

The fabrication process described above is provided as an example, and the fabrication process may be variously modified according to the design or purposes.

FIGS. 7 and 8 are views showing another example of a light emitting device according to the embodiment. In the following description about the light emitting device shown in FIGS. 7 and 8, components and structures the same as those described with reference to FIGS. 1 to 6 will be briefly described or omitted in order to avoid redundancy.

As shown in FIGS. 7 and 8, the light emitting device according to the embodiment may include a light emitting structure 10, a channel layer 30, a first electrode 81, a second electrode 82 and a connection wiring 85.

The light emitting device according to the embodiment may include the channel layer 30 arranged around a lower portion of the light emitting structure 10. For example, a top surface of the channel layer 30 may be aligned on the same plane with a bottom surface of the light emitting structure 10. One end of the channel layer 30 may be disposed under the second conductive semiconductor layer 13. One end of the channel layer 30 may come into contact with the bottom surface of the second conductive semiconductor layer 13. One end of the channel layer 30 may be disposed between the second conductive semiconductor layer 13 and the second electrode 82. One end of the channel layer 30 may be disposed between the second conductive semiconductor layer 13 and an ohmic contact layer 15.

For example, the channel layer 30 may be formed of oxide or nitride. For instance, the channel layer 30 may include at least one selected from the group consisting of $SiO_2$, $Si_xO_y$, $Si_3N_4$, $Si_xN_y$, $SiO_xN_y$, $Al_2O_3$, $TiO_2$, and AlN. The channel layer 30 may be called an isolation layer. The channel layer 30 may serve as an etching stopper when an isolation process is performed later with respect to the light emitting structure 10 and may prevent the electric characteristics of the light emitting device from being degraded caused by the isolation process.

The first electrode 81 may be disposed on the channel layer 30. The first electrode 81 may directly make contact with the top surface of the channel layer 30. The first electrode 81 may be arranged around a lower portion of the light emitting structure 10. The first electrode 81 may surround the light emitting structure 10. The first electrode 81 may have a width smaller than a width of the channel layer 30. For example, the channel layer 30 may have a width in the range of 5 micrometers to 70 micrometers and the first electrode 81 may have a width in the range of 5 micrometers to 30 micrometers.

The first electrode 81 may be electrically connected to the first conductive semiconductor layer 11. The first electrode 81 may be electrically connected to the first conductive semiconductor layer 11 through the connection wiring 85. The connection wiring 85 may electrically connect the first electrode 81 with the first conductive semiconductor layer 11.

The connection wiring 85 may be disposed on the first conductive semiconductor layer 11. The connection wiring 85 may be disposed on the first electrode 81. The connection wiring 85 may be disposed at a lateral side of the light emitting structure 10. A plurality of connection wirings 85 may be provided. At least two connection wirings 85 may be provided. The number of connection wiring 85 may be properly selected such that power applied from the first electrode 81 can be distributed onto the first conductive semiconductor layer 11. For example, 1 to 64 connection wirings 85 may be selectively provided. For example, the first electrode 81 and the connection wiring 85 may include at least one of Cr, V, W, Ti, Zn, Ni, Pt, Cu, Al, Au, and Mo.

In addition, the light emitting device according to the embodiment may include a central connection wiring 87. The central connection wiring 87 may be disposed on a top surface of the light emitting structure 10. The central connection wiring 87 may be electrically connected to the first electrode 81 to allow power to be effectively spread onto the first conductive semiconductor layer 11.

According to the light emitting device of the embodiment, the first electrode 81 may not be disposed on the light emitting structure 10. A part of the connection wiring 85 electrically connected to the first electrode 81 may be disposed on the light emitting structure 10. According to the embodiment, an area of a metal layer disposed on the first conductive semiconductor layer 11 is minimized so that the light emitting area can be expanded in the upward direction of the light emitting structure 10. Thus, the light emitting device according to the embodiment can improve the light efficiency.

The light emitting device according to the embodiment may include a bonding pad 90 electrically connected to the first electrode 81. The bonding pad 90 may be disposed on the first electrode 81. The bonding pad 90 may be disposed on the channel layer 30. The bonding pad 90 may be disposed around the light emitting structure 10. The bonding pad 90 may be disposed around a lower portion of the light emitting structure 10. The bonding pad 90 may be disposed at a lateral side of the light emitting structure 10. For example, the bonding pad 90 may include at least one of Cr, V, W, Ti, Zn, Ni, Pt, Cu, Al, Au, and Mo.

The light emitting device according to the embodiment may include the insulating layer 40 disposed between the connection wiring 85 and the light emitting structure 10. The insulating layer 40 may be disposed between the connection wiring 85 and the active layer 12. The insulating layer 40 may be disposed between the connection wiring 85 and the second conductive semiconductor layer 13.

For example, the insulating layer 40 may be formed of oxide or nitride. For instance, the insulating layer 40 may include at least one selected from the group consisting of $SiO_2$, $Si_xO_y$, $Si_3N_4$, $Si_xN_y$, $SiO_xN_y$, $Al_2O_3$, $TiO_2$, and AlN.

According to the embodiment, the second electrode 82 may include at least one of the reflective layer 17, the ohmic contact layer 15 and the metal layer 50. For example, the second electrode 82 may include all of the reflective layer 17, the ohmic contact layer 15 and the metal layer 50 or may selectively include one or two layers.

According to the embodiment, power may be applied to the light emitting structure 10 through the second electrode 82 and the first electrode 81. According to the embodiment, the first electrode 81 may include an ohmic layer, an intermediate layer, and an upper layer. The ohmic layer may include a material selected from the group consisting of Cr, V, W, Ti, and Zn to realize ohmic contact. The intermediate layer may be realized by using a material selected from the group consisting of Ni, Cu, and Al. For example, the upper layer may include Au. The first electrode 81 may include at least one selected from the group consisting of Cr, V, W, Ti, Zn, Ni, Cu, Al, Au and Mo.

In addition, according to the embodiment, the first electrode 81 and the bonding pad 90 are not disposed at an upper portion of the light emitting structure 10, so the light emitting area can be expanded. That is, according to the embodiment, the light extracted through the top surface of the light emitting structure 10 may not be absorbed in the first electrode 81 and the bonding pad 90 so that the light efficiency can be improved.

FIG. 9 is a view showing another example of a light emitting device according to the embodiment. In the following description about the light emitting device shown in FIG. 9, components and structures the same as those described with reference to FIGS. 1 to 6 will be briefly described or omitted in order to avoid redundancy.

As shown in FIG. 9, the light emitting device according to the embodiment may include a light emitting structure 10, a channel layer 30, a first electrode 81, a second electrode 82 and a connection wiring 85.

The light emitting device according to the embodiment may include the channel layer 30 arranged around a lower portion of the light emitting structure 10. For example, a top surface of the channel layer 30 may be aligned on the same plane with a bottom surface of the light emitting structure 10. One end of the channel layer 30 may be disposed under the second conductive semiconductor layer 13. One end of the channel layer 30 may come into contact with the bottom surface of the second conductive semiconductor layer 13. One end of the channel layer 30 may be disposed between the second conductive semiconductor layer 13 and the second electrode 82. One end of the channel layer 30 may be disposed between the second conductive semiconductor layer 13 and an ohmic contact layer 15.

For example, the channel layer 30 may be formed of oxide or nitride. For instance, the channel layer 30 may include at least one selected from the group consisting of $SiO_2$, $Si_xO_y$, $Si_3N_4$, $Si_xN_y$, $SiO_xN_y$, $Al_2O_3$, $TiO_2$, and AlN. The channel layer 30 may be called an isolation layer. The channel layer 30 may serve as an etching stopper when an isolation process is performed later with respect to the light emitting structure 10 and may prevent the electric characteristics of the light emitting device from being degraded caused by the isolation process.

The first electrode 81 may be disposed on the channel layer 30. The first electrode 81 may directly make contact with the top surface of the channel layer 30. The first electrode 81 may be arranged around a lower portion of the light emitting structure 10. The first electrode 81 may surround the light emitting structure 10. The first electrode 81 may have a width smaller than a width of the channel layer 30. For example, the channel layer 30 may have a width in the range of 5 micrometers to 70 micrometers and the first electrode 81 may have a width in the range of 5 micrometers to 30 micrometers.

The first electrode 81 may be electrically connected to the first conductive semiconductor layer 11. The first electrode 81 may be electrically connected to the first conductive semiconductor layer 11 through the connection wiring 85. The connection wiring 85 may electrically connect the first electrode 81 with the first conductive semiconductor layer 11.

The connection wiring 85 may be disposed on the first conductive semiconductor layer 11. The connection wiring 85 may be disposed on the first electrode 81. The connection wiring 85 may be disposed at a lateral side of the light emitting structure 10. The connection wiring 85 may come into contact with the lateral side of the light emitting structure 10. The connection wiring 85 may come into contact with a lateral side of the first conductive semiconductor layer 11.

A plurality of connection wirings 85 may be provided. At least two connection wirings 85 may be provided. The number of connection wiring 85 may be properly selected such that power applied from the first electrode 81 can be distributed onto the first conductive semiconductor layer 11. For example, 1 to 64 connection wirings 85 may be selectively provided. For example, the first electrode 81 and the connection wiring 85 may include at least one of Cr, V, W, Ti, Zn, Ni, Pt, Cu, Al, Au, and Mo.

According to the light emitting device of the embodiment, the first electrode 81 may not be disposed on the light emitting structure 10. A part of the connection wiring 85 electrically connected to the first electrode 81 may be disposed on the light emitting structure 10. According to the embodiment, an area of a metal layer disposed on the first conductive semiconductor layer 11 is minimized so that the light emitting area can be expanded in the upward direction of the light emitting structure 10. Thus, the light emitting device according to the embodiment can improve the light efficiency.

The light emitting device according to the embodiment may include a bonding pad 90 electrically connected to the first electrode 81. The bonding pad 90 may be disposed on the light emitting structure 10. The bonding pad 90 may be disposed on the first conductive semiconductor layer 11. The bonding pad 90 may be disposed at one lateral side of the first conductive semiconductor layer 11. The bonding pad 90 may be disposed at an edge area of one lateral side of the first conductive semiconductor layer 11. The bonding pad 90 may be disposed in the diagonal direction of the first conductive semiconductor layer 11. For example, the bonding pad 90 may include at least one of Cr, V, W, Ti, Zn, Ni, Pt, Cu, Al, Au, and Mo.

The light emitting device according to the embodiment may include the insulating layer 40 disposed between the connection wiring 85 and the light emitting structure 10. The insulating layer 40 may be disposed between the connection wiring 85 and the active layer 12. The insulating layer 40 may be disposed between the connection wiring 85 and the second conductive semiconductor layer 13.

For example, the insulating layer 40 may be formed of oxide or nitride. For instance, the insulating layer 40 may include at least one selected from the group consisting of $SiO_2$, $Si_xO_y$, $Si_3N_4$, $Si_xN_y$, $SiO_xN_y$, $Al_2O_3$, $TiO_2$, and AlN.

According to the embodiment, the second electrode 82 may include at least one of the reflective layer 17, the ohmic contact layer 15 and the metal layer 50. For example, the second electrode 82 may include all of the reflective layer 17, the ohmic contact layer 15 and the metal layer 50 or may selectively include one or two layers.

According to the embodiment, power may be applied to the light emitting structure 10 through the second electrode 82 and the first electrode 81.

According to the embodiment, the first electrode 81 may include an ohmic layer, an intermediate layer, and an upper layer. The ohmic layer may include a material selected from the group consisting of Cr, V, W, Ti, and Zn to realize ohmic contact. The intermediate layer may be realized by using a material selected from the group consisting of Ni, Cu, and Al. For example, the upper layer may include Au. The first electrode 81 may include at least one selected from the group consisting of Cr, V, W, Ti, Zn, Ni, Cu, Al, Au and Mo.

In addition, according to the embodiment, the first electrode 81 is not disposed at an upper portion of the light emitting structure 10, so the light emitting area can be expanded. That is, according to the embodiment, the light extracted through the top surface of the light emitting structure 10 may not be absorbed in the first electrode 81 so that the light efficiency can be improved.

FIG. 10 is a view showing another example of a light emitting device according to the embodiment. In the following description about the light emitting device shown in FIG. 10, components and structures the same as those described with reference to FIGS. 1 to 6 will be briefly described or omitted in order to avoid redundancy.

As shown in FIG. 10, the light emitting device according to the embodiment may include a light emitting structure 10, a channel layer 30, a first electrode 81, a second electrode 82 and a connection wiring 85.

The light emitting device according to the embodiment may include the channel layer 30 arranged around a lower portion of the light emitting structure 10. For example, a top surface of the channel layer 30 may be aligned higher than a top surface of the active layer 12. The channel layer 30 may be disposed around the active layer 12. The channel layer 30 may be disposed around the second conductive semiconductor layer 13. One end of the channel layer 30 may be disposed under the second conductive semiconductor layer 13. One end of the channel layer 30 may come into contact with the bottom surface of the second conductive semiconductor layer 13. One end of the channel layer 30 may be disposed between the second conductive semiconductor layer 13 and the second electrode 82. One end of the channel layer 30 may be disposed between the second conductive semiconductor layer 13 and an ohmic contact layer 15.

For example, the channel layer 30 may be formed of oxide or nitride. For instance, the channel layer 30 may include at least one selected from the group consisting of $SiO_2$, $Si_xO_y$, $Si_3N_4$, $Si_xN_y$, $SiO_xN_y$, $Al_2O_3$, $TiO_2$, and AlN. The channel layer 30 may be called an isolation layer. The channel layer 30 may serve as an etching stopper when an isolation process is performed later with respect to the light emitting structure 10 and may prevent the electric characteristics of the light emitting device from being degraded caused by the isolation process.

The first electrode 81 may be disposed on the channel layer 30. The first electrode 81 may directly make contact with the top surface of the channel layer 30. The first electrode 81 may be arranged around the light emitting structure 10. The first electrode 81 may surround the light emitting structure 10. The first electrode 81 may have a width smaller than a width of the channel layer 30. For example, the channel layer 30 may have a width in the range of 5 micrometers to 70 micrometers and the first electrode 81 may have a width in the range of 5 micrometers to 30 micrometers.

The first electrode 81 may be electrically connected to the first conductive semiconductor layer 11. The first electrode 81 may be electrically connected to the first conductive semiconductor layer 11 through the connection wiring 85. The connection wiring 85 may electrically connect the first electrode 81 with the first conductive semiconductor layer 11.

The connection wiring 85 may be disposed on the first conductive semiconductor layer 11. The connection wiring 85 may be disposed on the first electrode 81. The connection wiring 85 may be disposed at a lateral side of the light emitting structure 10. The connection wiring 85 may come into contact with the lateral side of the light emitting structure 10. The connection wiring 85 may come into contact with a lateral side of the first conductive semiconductor layer 11. For instance, the connection wiring 185 may come into contact with the lateral side of the first conductive semiconductor layer 11 without being disposed on the top surface of the first conductive semiconductor layer 11.

A plurality of connection wirings 85 may be provided. At least two connection wirings 85 may be provided. The number of connection wiring 85 may be properly selected such that power applied from the first electrode 81 can be distributed onto the first conductive semiconductor layer 11. For example, 1 to 64 connection wirings 85 may be selectively provided. For example, the first electrode 81 and the connection wiring 85 may include at least one of Cr, V, W, Ti, Zn, Ni, Pt, Cu, Al, Au, and Mo.

According to the light emitting device of the embodiment, the first electrode 81 may not be disposed on the light emitting structure 10. A part of the connection wiring 85 electrically connected to the first electrode 81 may be disposed on the light emitting structure 10. According to the embodiment, an area of a metal layer disposed on the first conductive semiconductor layer 11 is minimized so that the light emitting area can be expanded in the upward direction of the light emitting structure 10. Thus, the light emitting device according to the embodiment can improve the light efficiency.

The light emitting device according to the embodiment may include a bonding pad 90 electrically connected to the first electrode 81. The bonding pad 90 may be disposed on the first electrode 81. The bonding pad 90 may be disposed on the channel layer 30. The bonding pad 90 may be disposed around the light emitting structure 10. The bonding pad 90 may be disposed at a lateral side of the light emitting structure 10. For example, the bonding pad 90 may include at least one of Cr, V, W, Ti, Zn, Ni, Pt, Cu, Al, Au, and Mo.

The light emitting device according to the embodiment may include the insulating layer 40 disposed between the connection wiring 85 and the light emitting structure 10. The insulating layer 40 may be disposed between the connection wiring 85 and the active layer 12. The insulating layer 40 may be disposed between the connection wiring 85 and the second conductive semiconductor layer 13.

For example, the insulating layer 40 may be formed of oxide or nitride. For instance, the insulating layer 40 may include at least one selected from the group consisting of $SiO_2$, $Si_xO_y$, $Si_3N_4$, $Si_xN_y$, $SiO_xN_y$, $Al_2O_3$, $TiO_2$, and AlN.

According to the embodiment, the second electrode 82 may include at least one of the reflective layer 17, the ohmic contact layer 15 and the metal layer 50. For example, the second electrode 82 may include all of the reflective layer 17, the ohmic contact layer 15 and the metal layer 50 or may selectively include one or two layers.

According to the embodiment, power may be applied to the light emitting structure 10 through the second electrode 82 and the first electrode 81. According to the embodiment, the first electrode 81 may include an ohmic layer, an intermediate layer, and an upper layer. The ohmic layer may include a material selected from the group consisting of Cr, V, W, Ti, and Zn to realize ohmic contact. The intermediate layer may be realized by using a material selected from the group consisting of Ni, Cu, and Al. For example, the upper layer may include Au. The first electrode 81 may include at least one selected from the group consisting of Cr, V, W, Ti, Zn, Ni, Cu, Al, Au and Mo.

In addition, according to the embodiment, the first electrode 81 and the bonding pad 90 are not disposed at an upper portion of the light emitting structure 10, so the light emitting area can be expanded. That is, according to the embodiment, the light extracted through the top surface of the light emitting structure 10 may not be absorbed in the first electrode 81 and the bonding pad 90 so that the light efficiency can be improved.

FIG. 11 is a view showing a light emitting device package to which the light emitting device according to the embodiment is applied.

Referring to FIG. 11, the light emitting device package according to the embodiment may include a body 120, first and second lead electrodes 131 and 132 formed on the body 120, a light emitting device 100 provided on the body 120 and electrically connected to the first and second lead electrodes 131 and 132 and a molding member 140 that surrounds the light emitting device 100.

The body 120 may include silicon, synthetic resin or metallic material, and an inclined surface may be formed in the vicinity of the light emitting device 100.

The first and second lead electrodes 131 and 132 are electrically isolated from each other to supply power to the light emitting device 100. The first and second lead electrode 131 and 132 can improve the light efficiency by reflecting the light emitted from the light emitting device 100. Further, the first and second lead electrodes 131 and 132 may dissipate heat generated from the light emitting device 100 to the outside.

The light emitting device 100 may be installed on the body 120 or the first or second lead electrode 131 or 132.

The light emitting device 100 may be electrically connected to the first and second lead electrodes 131 and 132 through one of a wire scheme, a flip-chip scheme, and a die-bonding scheme.

The molding member 140 may surround the light emitting device 100 to protect the light emitting device 100. In addition, the molding member 140 may include phosphors to change the wavelength of the light emitted from the light emitting device 100.

A plurality of light emitting devices or light emitting device packages according to the embodiment may be arrayed on a substrate, and an optical member including a lens, a light guide plate, a prism sheet, or a diffusion sheet may be provided on the optical path of the light emitted from the light emitting device package. The light emitting device package, the substrate, and the optical member may serve as a light unit. The light unit is realized in a top view type or a side view type and variously provided in display devices of a portable terminal and a laptop computer or a lighting apparatus and an indicator apparatus. In addition, a lighting apparatus according to another embodiment may include a light emitting device, or a light emitting device package according to the embodiment. For example, the lighting apparatus may include a lamp, a street lamp, an electric sign board and a headlight of a vehicle.

The light emitting device according to the embodiment may be applied to the light unit. The light unit has a structure in which a plurality of light emitting devices are arrayed. The light unit may include a display device as shown in FIGS. 12 and 13 and the lighting apparatus as shown in FIG. 14.

Referring to FIG. 12, a display device 1000 according to the embodiment includes a light guide plate 1041, a light emitting module 1031 for supplying the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, the embodiment is not limited to the above structure.

The bottom cover 1011, the reflective member 1022, the light guide plate 1041 and the optical sheet 1051 may constitute a light unit 1050.

The light guide plate 1041 diffuses the light to provide surface light. The light guide plate 1041 may include transparent material. For example, the light guide plate 1041 may include one of acryl-based resin, such as PMMA (polymethyl methacrylate), PET (polyethylene terephthalate), PC (polycarbonate), COC (cyclic olefin copolymer) and PEN (polyethylene naphthalate) resin.

The light emitting module 1031 supplies the light to at least one side of the light guide plate 1041. The light emitting module 1031 serves as the light source of the display device.

At least one light emitting module 1031 is provided to directly or indirectly supply the light from one side of the light guide plate 1041. The light emitting module 1031 may include a substrate 1033 and light emitting devices 100 or the light emitting device package 200 according to the embodiment described above. The light emitting packages 200 may be arrayed on the substrate 1033 while being spaced apart from each other at the predetermined interval.

The substrate 1033 may be a printed circuit board (PCB) including a circuit pattern. In addition, the substrate 1033 may also include a metal core PCB (MCPCB) or a flexible PCB (FPCB) as well as the PCB, but the embodiment is not limited thereto. If the light emitting device packages 200 are installed on the lateral side of the bottom cover 1011 or on a heat dissipation plate, the substrate 1033 may be omitted. The heat dissipation plate may partially make contact with the top surface of the bottom cover 1011.

In addition, the light emitting device packages 200 are installed such that light exit surfaces of the light emitting device packages 200 are spaced apart from the light guide plate 1041 at a predetermined distance, but the embodiment is not limited thereto. The light emitting device packages 200 may directly or indirectly supply the light to a light incident part, which is one side of the light guide plate 1041, but the embodiment is not limited thereto.

The reflective member 1022 may be disposed below the light guide plate 1041. The reflective member 1022 reflects the light, which travels downward through the bottom surface of the light guide plate 1041, upward, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by using light passing through the optical sheet 1051. The display device 1000 can be applied to various portable terminals, monitors of notebook computers and laptop computers, and televisions.

The optical sheet 1051 is disposed between the display panel 1061 and the light guide plate 1041 and includes at least one transmissive sheet. For example, the optical sheet 1051 includes at least one of a diffusion sheet, horizontal and vertical prism sheets, and a brightness enhanced sheet. The diffusion sheet diffuses the incident light, the horizontal and/or vertical prism sheet concentrates the incident light onto a display region, and the brightness enhanced sheet improves the brightness by reusing the light to be lost. In addition, a protective sheet can be provided on the display panel 1061, but the embodiment is not limited thereto.

The light guide plate 1041 and the optical sheet 1051 can be provided on the optical path of the light emitting module 1031 as optical members, but the embodiment is not limited thereto.

FIG. 13 is a view showing another example of a display device according to the embodiment.

Referring to FIG. 13, the display device 1100 includes a bottom cover 1152, a substrate 1020 on which the light emitting devices 100 are arrayed, an optical member 1154, and a display panel 1155.

The substrate 1020 and the light emitting device packages 200 may constitute a light emitting module 1060.

The bottom cover 1152 can be provided therein with a receiving section 1153, but the embodiment is not limited thereto.

In this case, the optical member 1154 may include at least one of a lens, a light guide plate, a diffusion sheet, horizontal and vertical prism sheets, and a brightness enhanced sheet. The light guide plate may include PC or PMMA (Poly methyl methacrylate). The light guide plate can be omitted. The diffusion sheet diffuses the incident light, the horizontal and vertical prism sheets concentrate the incident light onto a display region, and the brightness enhanced sheet improves the brightness by reusing the light to be lost.

The optical member 1154 is disposed above the light emitting module 1060 in order to convert the light emitted from the light emitting module 1060 into the surface light. In addition, the optical member 1154 may diffuse or collect the light.

FIG. 14 is a view showing a lighting apparatus according to the embodiment.

Referring to FIG. 14, the lighting apparatus according to the embodiment may include a cover 2100, a light source module 2200, a radiator 2400, a power supply part 2600, an inner case 2700, and a socket 2800. The lighting apparatus according to the embodiment may further include at least one of a member 2300 and a holder 2500. The light source module 2200 may include the light emitting device package according to the embodiment.

For example, the cover 2100 may have a blub shape or a hemispheric shape. The cover 2100 may have a hollow structure which is partially open. The cover 2100 may be optically coupled with the light source module 2200. For example, the cover 2100 may diffuse, scatter, or excite light provided from the light source module 2200. The cover 2100 may be an optical member. The cover 2100 may be coupled with the radiator 2400. The cover 2100 may include a coupling part which is coupled with the radiator 2400.

The cover 2100 may include an inner surface coated with a milk-white pigment. The milk-white pigment may include a diffusion material to diffuse light. The roughness of the inner surface of the cover 2100 may be greater than the roughness of the outer surface of the cover 2100. The surface roughness is provided for the purpose of sufficiently scattering and diffusing the light from the light source module 2200.

The cover 2100 may include glass, plastic, polypropylene (PP), polyethylene (PE) or polycarbonate (PC). The polycarbonate (PC) has the superior light resistance, heat resistance and strength among the above materials. The cover 2100 may be transparent so that a user may view the light source module 2200 from the outside, or may be opaque. The cover 2100 may be formed through a blow molding scheme.

The light source module 2200 may be disposed at one surface of the radiator 2400. Accordingly, the heat from the light source module 2200 is transferred to the radiator 2400. The light source module 2200 may include a light source 2210, a connection plate 2230, and a connector 2250.

The member 2300 is disposed on a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white pigment. The member 2300 reflects again light, which is reflected by the inner surface of the cover 2100 and is returned to the direction of the light source module 2200, to the direction of the cover 2100. Accordingly, the light efficiency of the lighting apparatus according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be formed by an insulating material, thereby preventing the connection plate 2230 from being electrically shorted with the radiator 2400. The radiator 2400 receives heat from the light source module 2200 and the power supply part 2600 and dissipates the heat.

The holder 2500 covers a receiving groove 2719 of an insulating part 2710 of an inner case 2700. Accordingly, the power supply part 2600 received in the insulating part 2710 of the inner case 2700 is sealed. The holder 2500 includes a guide protrusion 2510. The guide protrusion 2510 has a hole and a protrusion of the power supply part 2600 extends by passing through the hole.

The power supply part 2600 processes or converts an electric signal received from the outside and provides the processed or converted electric signal to the light source module 2200. The power supply part 2600 is received in the receiving groove 2719 of the inner case 2700, and is sealed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed on one surface of the base 2650. For example, the components may include a DC converter to convert AC power provided from an external power supply into DC power, a driving chip to control the driving of the light source module 2200, and an electrostatic discharge (ESD) protection device to protect the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiment can provide the light emitting device, the light emitting device package and the light unit, capable of improving the light efficiency by expanding the light emitting area.

The invention claimed is:

1. A light emitting device comprising:
a light emitting structure including a first conductive semiconductor layer, an active layer under the first conductive semiconductor layer, and a second conductive semiconductor layer under the active layer;
a channel layer around a lower portion of the light emitting structure;
a first electrode on the channel layer;
a second electrode under the light emitting structure;
a connection wiring for electrically connecting the first electrode and the first conductive semiconductor layer; and
an insulating layer between the connection wiring and the light emitting structure,
wherein the first electrode is not overlapped with the light emitting structure in a vertical direction, and
wherein a top surface of the channel layer is aligned higher than a top surface of the active layer.

2. The light emitting device of claim 1, wherein the first electrode is arranged around the lower portion of the light emitting structure.

3. The light emitting device of claim 1, wherein the connection wiring is arranged on the first conducive semiconductor layer.

4. The light emitting device of claim 1, wherein the connection wiring makes contact with a lateral side of the first conducive semiconductor layer.

5. The light emitting device of claim 1, further comprising a bonding pad electrically connected to the first electrode.

6. The light emitting device of claim 5, wherein the bonding pad is arranged on the first conductive semiconductor layer.

7. The light emitting device of claim 5, wherein the bonding pad is arranged on the channel layer.

8. The light emitting device of claim 5, wherein the bonding pad is arranged around the lower portion of the light emitting structure.

9. The light emitting device of claim 1, wherein at least two connection wirings are provided.

10. The light emitting device of claim 1, wherein the insulating layer is arranged between the connection wiring and the active layer.

11. The light emitting device of claim 1, wherein the second electrode includes at least one of an ohmic contact layer, a reflective layer and a metal layer.

12. The light emitting device of claim 1, wherein the connection wiring includes at least one of Cr, V, W, Ti, Zn, Ni, Pt, Cu, Al, Au, or Mo.

13. The light emitting device of claim 1, wherein the channel layer is disposed around the active layer.

14. A light emitting device comprising:
a light emitting structure including a first conductive semiconductor layer, an active layer under the first conductive semiconductor layer, and a second conductive semiconductor layer under the active layer;
a channel layer around a lower portion of the light emitting structure;
a first electrode on the channel layer;
a second electrode under the light emitting structure;
a connection wiring for electrically connecting the first electrode and the first conductive semiconductor layer; and
an insulating layer between the connection wiring and the light emitting structure,
wherein the first electrode has a width smaller than a width of the channel layer,
wherein the first electrode is arranged at a lateral side of the light emitting structure, and
wherein the first electrode has the width in a range of 5 μm to 30 μm.

15. The light emitting device of claim 14, wherein the channel layer has a width in a range of 5 μm to 70 μm.

16. The light emitting device of claim 14, wherein the channel layer is disposed around the second conductive semiconductor layer.

17. A light emitting device comprising:
a light emitting structure including a first conductive semiconductor layer, an active layer under the first conductive semiconductor layer, and a second conductive semiconductor layer under the active layer;
a channel layer around a lower portion of the light emitting structure;
an insulating layer on the channel layer;
a first electrode on the channel layer;
a second electrode under the light emitting structure;
a connection wiring for electrically connecting the first electrode and the first conductive semiconductor layer; and
a bonding pad electrically connected to the first electrode,
wherein the bonding pad is arranged on an upper portion of the connection wiring,
wherein the insulating layer is arranged between the connection wiring and the light emitting structure,
wherein the light emitting structure is formed on a top surface thereof with a light extraction pattern,
a concavo-convex pattern corresponding to the light extraction pattern is formed at a bottom surface of the connection wiring under the bonding pad, and
wherein a top surface of the channel layer is aligned higher than a top surface of the active layer.

18. The light emitting device of claim 17, further comprising a central connection wiring arranged on a top surface of the light emitting structure.

19. The light emitting device of claim 18, wherein the central connection wiring is electrically connected to the first electrode.

20. The light emitting device of claim 18, wherein the connection wiring is arranged on the first electrode between the bonding pad and the insulating layer.

* * * * *